(12) United States Patent
Wang

(10) Patent No.: US 12,550,367 B2
(45) Date of Patent: Feb. 10, 2026

(54) SEMICONDUCTOR STRUCTURE AND METHOD FOR FORMING SAME

(71) Applicants: Semiconductor Manufacturing International (Beijing) Corporation, Beijing (CN); Semiconductor Manufacturing International (Shanghai) Corporation, Shanghai (CN)

(72) Inventor: Ye Wang, Beijing (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 403 days.

(21) Appl. No.: 18/219,227

(22) Filed: Jul. 7, 2023

(65) Prior Publication Data
US 2024/0145590 A1 May 2, 2024

(30) Foreign Application Priority Data
Oct. 28, 2022 (CN) .......................... 202211334868.6

(51) Int. Cl.
*H01L 29/78* (2006.01)
*H10D 30/01* (2025.01)
*H10D 30/65* (2025.01)
*H10D 62/17* (2025.01)
*H10D 64/00* (2025.01)

(52) U.S. Cl.
CPC ......... *H10D 30/65* (2025.01); *H10D 30/0281* (2025.01); *H10D 62/393* (2025.01); *H10D 64/111* (2025.01)

(58) Field of Classification Search
None
See application file for complete search history.

(56) References Cited

FOREIGN PATENT DOCUMENTS

CN 113889523 A * 1/2022 ........... H10D 64/513

* cited by examiner

*Primary Examiner* — William C Trapanese
(74) *Attorney, Agent, or Firm* — Crowell & Moring LLP

(57) ABSTRACT

A semiconductor structure and a method for forming same. The structure includes: a base substrate; a gate structure, located on the base substrate; a drift region, located in the base substrate on one side of the gate structure; a body region, located in the base substrate on the other side of the gate structure; a drain region, located in the drift region on one side of the gate structure; a source region, located in the body region on the other side of the gate structure; and a floating field plate, located on the drift region between the gate structure and the drain region, where the floating field plate has notches arranged at intervals along a width direction of the gate structure, and the floating field plate also has notches arranged at intervals along a length direction of the gate structure.

20 Claims, 8 Drawing Sheets

SEMICONDUCTOR STRUCTURE AND METHOD FOR FORMING SAME

RELATED APPLICATIONS

The present application claims priority to Chinese Patent Application No. 202211334868.6, filed on Oct. 28, 2022, the entire content of which is incorporated herein by reference.

TECHNICAL FIELD

Embodiments and implementations of the present disclosure relate to the field of semiconductor manufacturing, and in particular, to a semiconductor structure and a method for forming same.

BACKGROUND

Accompanied with the rapid development of semiconductor manufacturing technologies, semiconductor devices are developing towards higher component density, higher integration, and higher performance. A power semiconductor device (Power Electronic Device) is a high-power electronic device (typically referring to a device having a current of tens to thousands of amperes or above and a voltage of hundreds of volts or above) mainly used in electric energy conversion and circuit control of electric equipment.

A laterally diffused metal oxide semiconductor (laterally diffused metal oxide semiconductor, LDMOS) is a power device having a dual-diffusion structure, which is commonly used in radio frequency power circuits. In a high-voltage power integrated circuit, a high-voltage LDMOS is commonly used to meet the requirements of high-voltage tolerance, power control, and the like. A laterally dual-diffused field effect transistor (LDMOS) has many advantages, for example, having a relatively high thermal stability and frequency stability, a relatively good gain and durability, a relatively low feedback capacitance and thermal resistance, a constant input impedance, and a simple bias current circuit. In addition, the LDMOS can also have good process compatibility with a CMOS, and therefore, LDMOS's are being widely used.

However, the electrical properties of LDMOS devices are still to be improved at present.

SUMMARY

A problem to be addressed by embodiments and implementations of the present disclosure is to provide a semiconductor structure and a method for forming same, so as to guarantee the reliability of a device.

To address the above problem, embodiments and implementations of the present disclosure provide a semiconductor structure. In one form, a semiconductor structure includes: a base substrate; a gate structure, located on the base substrate; a drift region, located in the base substrate on one side of the gate structure; a body region, located in the base substrate on the other side of the gate structure; a drain region, located in the drift region on one side of the gate structure; a source region, located in the body region on the other side of the gate structure; and a floating field plate, located on the drift region between the gate structure and the drain region, where the floating field plate has notches arranged at intervals along a width direction of the gate structure, and the floating field plate also has notches arranged at intervals along a length direction of the gate structure.

In some implementations, the semiconductor structure further comprises: an isolation layer, located in the drift region between the gate structure and the drain region, wherein the floating field plate is located on the isolation layer.

In some implementations, the semiconductor structure further comprises: a reverse type ion implantation region, located in the drift region below the isolation layer, wherein a type of ions of the reverse type ion implantation region is opposite to that of the drift region.

In some implementations, the semiconductor structure further comprises: a protection layer, located on the drift region and covering the floating field plate.

In some implementations, along the width direction of the gate structure, the protection layer further extends to cover part of the gate structure close to the floating field plate.

In some implementations, the protection layer is a metal silicide block layer.

In some implementations, the semiconductor structure further comprises: an inter-layer dielectric layer, covering surfaces of the gate structure, the protection layer, and the base substrate.

In some implementations, the semiconductor structure further comprises: a drain region contact, passing through the inter-layer dielectric layer on a top portion of the drain region and in contact with a top surface of the drain region; and a drain region field plate, located on the inter-layer dielectric layer and in contact with the drain region contact, wherein the drain region field plate extends from a position above the drain region to a position above an edge portion, of the drift region, close to the drain region.

In some implementations, the semiconductor structure further comprises: a source region contact, passing through the inter-layer dielectric layer on a top portion of the source region and in contact with a top surface of the source region; and a source region field plate, located on the inter-layer dielectric layer and in contact with the source region contact, wherein the source region field plate extends from a position above the source region to a position above an edge portion, of the drift region, close to the body region.

In some implementations, the semiconductor structure further comprises: a gate contact, passing through the inter-layer dielectric layer on a top portion of the gate structure and in contact with a top surface of the gate structure.

In some implementations, a dielectric coefficient of a material of the floating field plate is less than a dielectric coefficient of the inter-layer dielectric layer.

In some implementations, a material of the floating field plate comprises polysilicon.

In some implementations, a material of the gate structure comprises polysilicon.

In some implementations, the floating field plate comprises a plurality of strip-shaped structure columns arranged in parallel along the width direction of the gate structure, where each strip-shaped structure column comprises a plurality of strip-shaped structures arranged in parallel along the length direction of the gate structure, and adjacent strip-shaped structures are arranged in a staggered manner along the width direction of the gate structure; or the floating field plate comprises a plurality of first strip-shaped structures extending along a first direction and arranged in parallel along a second direction and a plurality of second strip-shaped structures extending along the second direction and arranged in parallel along the first direction, the first strip-shaped structures the second strip-shaped structures are arranged in a crossed manner, and the first direction is perpendicular to the second direction; or the floating field plate comprises a plurality of strip-shaped structures extending along the width direction of the gate structure and arranged in parallel along the length direction of the gate structure and connecting parts each located in a gap between adjacent strip-shaped structures and in contact with the adjacent strip-shaped structures, the plurality of connecting parts is arranged in parallel along the width direction of the gate structure, and the adjacent connecting parts are arranged in a staggered manner along the length direction of the gate structure; or the floating field plate comprises a plurality of strip-shaped structures extending along the length direction of the gate structure and arranged in parallel along the width direction of the gate structure and connecting parts each located in a gap between adjacent strip-shaped structures and in contact with the adjacent strip-shaped structures, the plurality of connecting parts is arranged in parallel along the length direction of the gate structure, and the adjacent connecting parts are arranged in a staggered manner along the width direction of the gate structure.

In some implementations, the first direction comprises the width direction of the gate structure, or a direction having an angle of 45° with the width direction of the gate structure.

The present disclosure also provides a method for forming a semiconductor structure. In one form, a method includes: providing a base substrate, in which a drift region is formed; forming a gate structure on the base substrate, where the gate structure spans to cover part of a top portion of the drift region; forming a floating field plate on the drift region on one side of the gate structure, where the floating field plate has notches arranged at intervals along a width direction of the gate structure, and the floating field plate also has notches arranged at intervals along a length direction of the gate structure; forming a body region in the base substrate on a side of the gate structure facing away from the drift region; forming a drain region in the drift region on one side of the gate structure; and forming a source region in the body region on the other side of the gate structure.

In some implementations, in the step of providing the base substrate, an isolation layer is further formed in the drift region between the gate structure and the drain region; and in the step of forming a floating field plate on the drift region between the gate structure and the drain region, the floating field plate is formed on the isolation layer.

In some implementations, in the step of providing the base substrate, a reverse type ion implantation region is formed in the drift region below the isolation layer, wherein a type of ions of the reverse type ion implantation region is opposite to that of the drift region.

In some implementations, the gate structure and the floating field plate are formed in the same step.

In some implementations, the step of forming the gate structure and the floating field plate comprises: forming a gate material layer covering the base substrate; and patterning gate material layer, to retain part of the gate material layer that spans to cover part of the top portion of drift region as the gate structure and to retain part of the gate material layer on the drift region on the side of the gate structure as the floating field plate.

In some implementations, a material of the gate material layer comprises polysilicon.

In some implementations, before forming the source region and the drain region, the forming method further comprises: forming a protection layer on the drift region and covering the floating field plate.

In some implementations, in the step of forming the protection layer, the protection layer further extends to cover part of the gate structure close to the floating field plate.

In some implementations, after forming the protection layer on the drift region and covering the floating field plate, the forming method further comprises: forming an inter-layer dielectric layer covering surfaces of the gate structure, the protection layer, and the base substrate.

In some implementations, after forming the inter-layer dielectric layer, the forming method further comprises: forming a drain region contact passing through the inter-layer dielectric layer on a top portion of the drain region and in contact with a top surface of the drain region; forming a source region contact passing through the inter-layer dielectric layer on a top portion of the source region and in contact with a top surface of the source region; forming a gate contact passing through the inter-layer dielectric layer on a top portion of the gate structure and in contact with a top surface of the gate structure; forming, on the inter-layer dielectric layer, a drain region field plate in contact with the drain region contact, wherein the drain region field plate extends from a position above the drain region to a position above an edge portion, of the drift region, close to the drain region; and forming, on the inter-layer dielectric layer, a source region field plate in contact with the source region contact, wherein the source region field plate extends from a position above the source region to a position above an edge portion, of the drift region, close to the body region.

Compared with the prior art, technical solutions of embodiments and implementations of the present disclosure have at least the following advantages:

In implementations of a semiconductor structure provided by the present disclosure, the floating field plate is located on the drift region between the gate structure and the drain region, where the floating field plate has notches arranged at intervals along the width direction of the gate structure, and the floating field plate also has notches arranged at intervals along the length direction of the gate structure.

In embodiments and implementations of the present disclosure, since the floating field plate has notches arranged at intervals along the width direction of the gate structure and the floating field plate also has notches arranged at intervals along the length direction of the gate structure, the floating field plate has discontinuous structures along both the width direction and the length direction of the gate structure, which is beneficial to reducing an electric field between the gate structure and the drain region by using a field plate effect of the floating field plate, so as to enable the field plate effect of the floating field plate on the surface of the base substrate to be relatively uniform while improving a breakdown voltage of the device, so that a reduction in the reliability of the device caused by a rapid change in the electric field at an edge of a floating field plate due to use of a floating field plate having a large continuous structure is avoided. Hence, embodiments and implementations of the present disclosure are beneficial to guaranteeing the reliability of the device while improving the breakdown voltage of the device.

In implementations of a forming method provided by the present disclosure, a floating field plate is formed on the drift region on one side of the gate structure, where the floating field plate has notches arranged at intervals along a width direction of the gate structure, and the floating field plate also has notches arranged at intervals along a length direction of the gate structure.

In embodiments and implementations of the present disclosure, since the floating field plate has notches arranged at intervals along the width direction of the gate structure and the floating field plate also has notches arranged at intervals along the length direction of the gate structure, the floating field plate has discontinuous structures along both the width direction and the length direction of the gate structure, which is beneficial to reducing an electric field between the gate structure and the drain region by using a field plate effect of the floating field plate, so as to enable the field plate effect of the floating field plate on the surface of the base substrate to be relatively uniform while improving a breakdown voltage of the device, so that a reduction in the reliability of the device caused by a rapid change in the electric field at an edge of a floating field plate due to use of a floating field plate having a large continuous structure is avoided.

Hence, embodiments and implementations of the present disclosure are beneficial to guaranteeing the reliability of the device while improving the breakdown voltage of the device.

DETAILED DESCRIPTION

At present, the working performance of a semiconductor structure needs to be guaranteed. The reasons why the working performance of a semiconductor structure needs to be guaranteed are analyzed in combination with two semiconductor structures.

Figure 1:
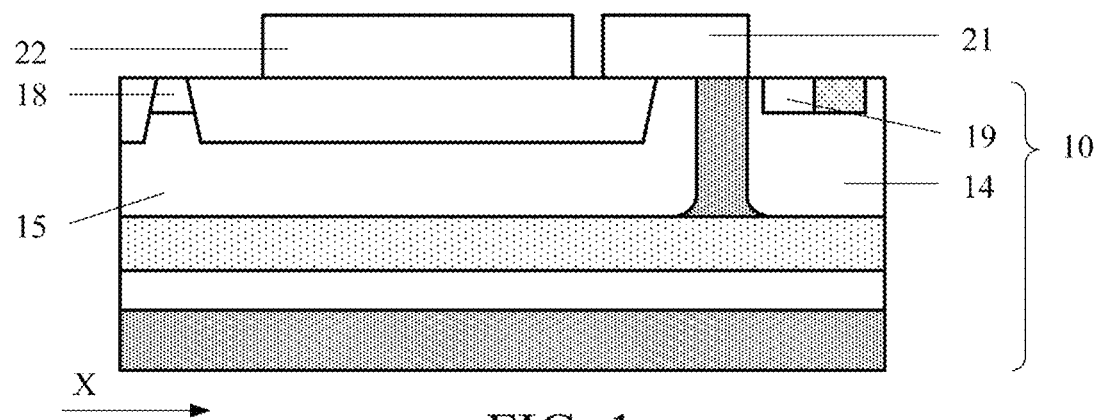
FIG. 1 and FIG. 2 are schematic structural diagrams of a semiconductor structure.
Figure 2:
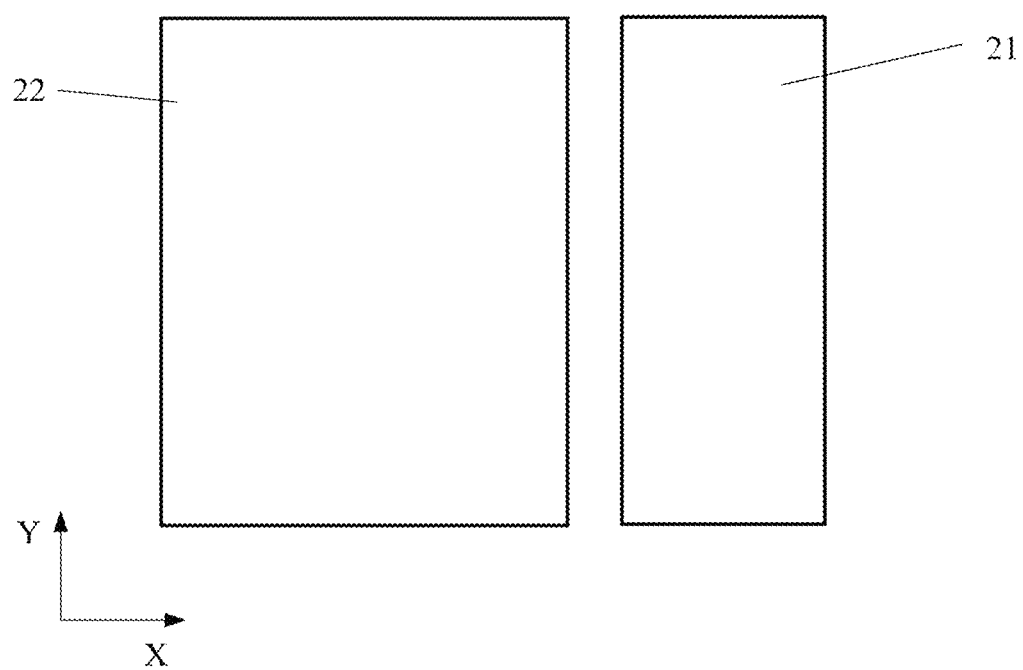

FIG. 1 and FIG. 2 are schematic structural diagrams of a semiconductor structure.

In combination with FIG. 1 and FIG. 2, FIG. 2 is a top view of a floating field plate and a gate structure in FIG. 1. The semiconductor structure includes: a base substrate 10; a gate structure 21, located on the base substrate 10; a drift region 15, located in the base substrate 10 on one side of the gate structure 21; a body region 14, located in the base substrate 10 on the other side of the gate structure 21; a drain region 18, located in the drift region 15 on one side of the gate structure 21; a source region 19, located in the body region 14 on the other side of the gate structure 21; and a field plate 22, located on the drift region 15 between the gate structure 21 and the drain region 18, where the field plate 22 extends along a width direction and a length direction of the gate structure 21 to cover part of a top of the drift region 15.

The use of the field plate 22 having a large continuous structure to reduce an electric field between the gate structure 21 and the drain region 18 is apt to cause a problem of a rapid change in the electric field at an edge of the field plate 22, resulting in a reduction in the reliability of the device.

To address the above technical problem, embodiments and implementations of the present disclosure provide a semiconductor structure. In one form, a semiconductor structure includes: a base substrate; a gate structure, located on the base substrate; a drift region, located in the base substrate on one side of the gate structure; a body region, located in the base substrate on the other side of the gate structure; a drain region, located in the drift region on one side of the gate structure; a source region, located in the body region on the other side of the gate structure; and a floating field plate, located on the drift region between the gate structure and the drain region, where the floating field plate has notches arranged at intervals along a width direction of the gate structure, and the floating field plate also has notches arranged at intervals along a length direction of the gate structure.

In some implementations of the present disclosure, since the floating field plate has notches arranged at intervals along the width direction of the gate structure and the floating field plate also has notches arranged at intervals along the length direction of the gate structure, the floating field plate has discontinuous structures along both the width direction and the length direction of the gate structure, which is beneficial to reducing an electric field between the gate structure and the drain region by using a field plate effect of the floating field plate, so as to enable the field plate effect of the floating field plate on the surface of the base substrate to be relatively uniform while improving a breakdown voltage of the device, so that a reduction in the reliability of the device caused by a rapid change in the electric field at an edge of a floating field plate due to use of a floating field plate having a large continuous structure is avoided. Hence, embodiments and implementations of the present disclosure are beneficial to guaranteeing the reliability of the device while improving the breakdown voltage of the device.

To make the foregoing objectives, features, and advantages of the present disclosure more apparent and easier to understand, specific embodiments and implementations of the present disclosure are described in detail below with reference to the accompanying drawings.

FIG. 3 to FIG. 7 are schematic structural diagrams of one form of a semiconductor structure according to the present disclosure.

Figure 3:
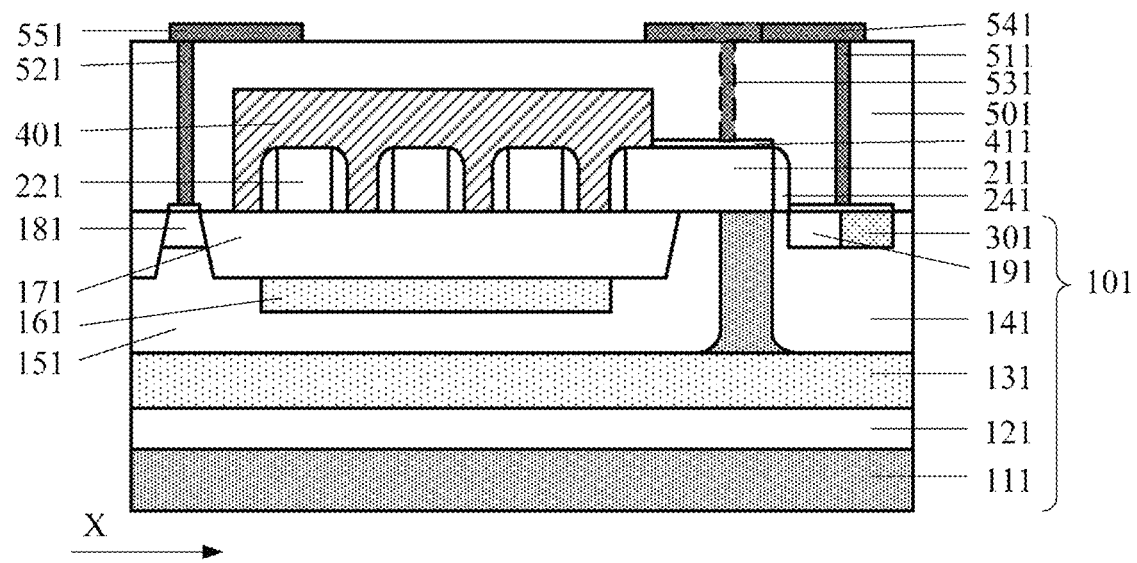
FIG. 3 to FIG. 7 are schematic structural diagrams of one form of a semiconductor structure according the present disclosure.

In combination with FIG. 3 to FIG. 7, FIG. 4 to FIG. 7 are top views of FIG. 3. The semiconductor structure includes: a base substrate 101; a gate structure 211, located on the base substrate 101; a drift region 151, located in the base substrate 101 on one side of the gate structure 211; a body region 141, located in the base substrate 101 on the other side of the gate structure 211; a drain region 181, located in the drift region 151 on one side of the gate structure 211; a source region 181, located in the body region 141 on the other side of the gate structure 211; and a floating field plate 221, located on the drift region 151 between the gate structure 211 and the drain region 181, where the floating field plate 221 has notches 231 arranged at intervals along a width direction (indicated by an X direction in FIG. 3) of the gate structure 211, and the floating field plate 221 also has notches 231 arranged at intervals along a length direction (indicated by a Y direction in FIG. 4) of the gate structure 211.

The semiconductor structure is an LDMOS transistor, and the LDMOS transistor may be an N-type transistor or a P-type transistor.

The base substrate 101 is configured to provide a process platform for forming the semiconductor structure. In some implementations, the base substrate 101 includes a substrate 111.

A material of the substrate 111 is silicon. In other implementations, the material of the substrate may alternatively be germanium, silicon carbide, silicon germanide, gallium arsenide, indium gallide, or silicon on an insulator.

In some implementations, for example, the LDMOS device is an N-type device, the substrate 111 is a P-type substrate (P-type Substrate), and the substrate 111 is doped with P-type ions. In other implementations, in a case that the LDMOS device is a P-type device, the substrate is an N-type substrate, and correspondingly, the substrate is doped with N-type ions.

In some implementations, the base substrate 101 further includes other types of device regions, for example: a core region (not shown) for forming a core device (Core device) and a peripheral region (not shown) for forming an input/output device (Input/Output device, I/O device).

The core device mainly refers to a device used in a chip, typically using a relatively low voltage and a relatively high working frequency. The input/output device typically refers to a device used when a chip interacts with an external interface. A working voltage of such type of devices is generally high, and the working voltage of the input/output device is typically greater than the working voltage of the core device, and a working frequency of the input/output device is typically less than the working frequency of the core device.

In some implementations, the base substrate 101 further includes: a buried layer 121 located on the substrate 111, where a type of ions doped in the buried layer 121 is opposite to a type of ions doped in the substrate 111.

In some implementations, the buried layer 121 is an N-type ion implantation buried layer and is configured to form an isolation structure between the substrate 111 and a device above.

In some implementations, the base substrate 101 further includes: an epitaxial isolation layer 131 located on the buried layer 121, where a type of ions doped in the epitaxial isolation layer 131 is opposite to a type of ions doped in the buried layer 121.

In some implementations, the epitaxial isolation layer 131 is a P-type ion epitaxial isolation layer and is configured to isolate the buried layer 121 and the device located on the epitaxial isolation layer 131, and together with the buried layer 121, form an isolation structure between the substrate 111 and the device above.

During working of the device, the gate structure 211 is configured to control on or off of a conductive channel.

In some implementations, the gate structure 211 intersects with surfaces of the drift region 151 and the body region 141, so that part of the body region 131 covered by the gate structure 211 and the substrate 111 located between the drift region 151 and the body region 141 serves as an effective channel region.

The gate structure 211 includes a gate dielectric layer (not shown) and a gate electrode layer (not shown) on a surface of the gate dielectric layer.

A material of the gate dielectric layer is silicon oxide, silicon nitride, or silicon oxynitride. A material of the gate dielectric layer may alternatively be a high-k gate dielectric material, for example, $HfO_2$ or $Al_2O_3$.

In some implementations, a material of the gate structure 211 is polysilicon.

In some implementations, the semiconductor structure further includes: a gate spacer 241 covering a side wall of the gate structure 211. The gate spacer 241 protects the side wall of the gate structure 211, and the gate spacer 241 also defines a position of a source region 191.

A material of the gate spacer 241 may be one or more of silicon oxide, silicon nitride, silicon carbide, silicon carbonitride, silicon oxycarbonitride, silicon oxynitride, boron nitride, and boron carbonitride, and the gate spacer 241 may be a single-layer structure or a laminated structure. In some implementations, the gate spacer 241 is a single-layer structure and is made of silicon nitride.

The drift region 151 facilitates in improving a breakdown voltage between the source region 191 and the drain region 181 and in reducing a parasitic capacitance between the source region 191 and the drain region 181, which is beneficial to improving the frequency characteristics. In addition, the drift region 151 serves as a buffer between the channel and the drain region 181, which is beneficial to weakening the short-channel effect of the LDMOS device.

A doping type of the drift region 151 is P-type doping or N-type doping. In some implementations, the LDMOS device is an N-type device, and correspondingly, the doping type of the drift region 151 is N-type doping, and doped ions for the N-type doping are P, As, or Sb.

The drift region 151 is a high-resistance region, so a concentration of ions doped in the drift region 151 is small, and the concentration of ions doped in the drift region 151 is less than a concentration of ions doped in the drain region 181, which is equivalent to forming a high-resistance layer between the source region 191 and the drain region 181, so that the breakdown voltage can be increased, the parasitic capacitance between the source region 191 and the drain region 181 can be reduced, and the frequency characteristics can be improved.

The body region 141 is configured to form a conductive channel having a concentration gradient. Specifically, the part of the body region 141 covered by the gate structure 211 serves as an effective channel region.

A doping type of the body region 141 is N-type doping or P-type doping, and the doping type the body region 141 is different from a doping type the drift region 151. In some implementations, the doping type of the body region 141 is P-type doping, and doped ions for the P-type doping are B, Ga, or In.

In some implementations, the semiconductor structure further includes: an isolation layer 171, located in the drift region 151 between the gate structure 211 and the drain region 181.

For example, in some implementations, the isolation layer 171 is a shallow trench isolation structure.

For an LDMOS transistor, the drain region 181 needs to withstand a high voltage, and a hot carrier injection (HCI) effect is relatively significant. The isolation layer 171 is configured to alleviate the hot carrier injection effect and further improve a breakdown voltage of the LDMOS transistor. In some implementations, a material of the isolation layer 171 is silicon oxide. In other implementations, the material thereof may alternatively be another dielectric material such as silicon nitride or silicon oxynitride.

In some implementations, the isolation layer 171 further serves as a field plate (field plate). During working of the device, a current between the drain region 181 and the source region 191 flows along a bottom portion of the isolation layer 171, which reduces an electric field strength on a surface of the device and improves the breakdown voltage of the device.

In some implementations, the semiconductor structure further includes: a reverse type ion implantation region 161, located in the drift region 151 below the isolation layer 171, where a type of ions of the reverse type ion implantation region 161 is opposite to a type of ions of the drift region 151.

In some implementations, the LDMOS device is an N-type device, and correspondingly, the doping type of the reverse type ion implantation region 161 is P-type doping, and doped ions for the P-type doping are B, Ga, or In.

In some implementations, the reverse type ion implantation region 161 serves as a field plate. During working of the device, a flow depth of a current between the drain region 181 and the source region 191 is further increased and a resistance between the source region 191 and the drain region 181 can also be increased, which reduce an electric field strength on a surface of the device and improve the breakdown voltage of the device.

The drain region 181 serves as a drain terminal of the LDMOS transistor. In some implementations, the base substrate 101 is exposed out of a surface of the drain region 181, and the drain region 181 has N-type doped ions. The drain region 181 and the gate structure 211 are separated by a lateral distance to improve the voltage tolerance performance of the LDMOS transistor. That the drain region 181 and the gate structure 211 are separated by a lateral distance refers to: in a direction perpendicular to the side wall of the gate structure 211, the drain region 181 is located on the side of the gate structure 211 and is isolated from the gate structure 211.

The source region 191 serves as a source terminal of the LDMOS transistor. A doping type the source region 191 is the same as a doping type of the drain region 181, and a concentration of ions doped in the source region 191 is the same as a concentration of ions doped in the drain region 181.

In some implementations, a body contact region 301 is also formed in the body region 141 on a side of the source region 191 away from the gate structure 211, and a side wall of the body contact region 301 is in contact with a side wall of the source region 191. The body region 141 is circumscribed through the body contact region 301. The body contact region 301 has P-type doped ions, and a concentration of ions doped in the body contact region 301 is greater than a concentration of ions doped in the body region 141, so that a resistance of the body contact region 301 is relatively small.

In some implementations, since the floating field plate 221 has notches 231 arranged at intervals along the width direction of the gate structure 211 and the floating field plate 221 also has notches 231 arranged at intervals along the length direction of the gate structure 211, the floating field plate 221 has discontinuous structures along both the width direction and the length direction of the gate structure 211, which is beneficial to reducing an electric field between the gate structure 211 and the drain region 181 by using a field plate effect of the floating field plate 221, so as to enable the field plate effect of the floating field plate 221 on the surface of the base substrate 101 to be relatively uniform while improving a breakdown voltage of the device, so that a reduction in the reliability of the device caused by a rapid change in the electric field at an edge of a floating field plate due to use of a floating field plate having a large continuous structure is avoided. Hence, this implementation is beneficial to guaranteeing the reliability of the device while improving the breakdown voltage of the device.

It should be noted that: the width direction of the gate structure 211 is a channel length direction, that is, a direction in which the drain region 181 points to the source region 191, and the length direction of the gate structure 211 is a channel width direction, that is, a direction perpendicular to a direction in which the drain region 181 points to the source region 191.

In some implementations, the floating field plate 221 is located on the isolation layer 171, so as to reduce the electric field strength on a surface of the isolation layer 171 and improve the breakdown voltage of the device.

It should be noted that: in some implementations, the floating field plate 221 is located in a middle region of the isolation layer 171, which is beneficial to preventing impact on the reliability of the device caused by a rapid change in an electric field at a junction between the isolation layer 171 and the drain region 181 resulted from a reduction in the electric field of the isolation layer 171 close to the drain region 181 due to an excessively large electric field at the junction between the isolation layer 171 and the drain region 181 caused by an excessively short boundary distance between the floating field plate 221 and the isolation layer 171.

In some implementations, a material of the floating field plate 221 includes polysilicon.

The use of polysilicon to form the floating field plate 221 is beneficial to obtaining a suitable dielectric constant, reducing the electric field strength on the surface of the isolation layer 171, increasing the breakdown voltage of the LDMOS device, and further improving the electrical properties of the LDMOS device. In addition, a material of the floating field plate 221 is the same as a material of the gate structure 211, which is beneficial to also forming the floating field plate 221 in the step of forming the gate structure 211, so that a forming process of the floating field plate 221 is compatible with a forming process of the gate structure 211, and that the floating field plate 221 can be formed without adding an additional step, thereby improving the process efficiency and saving the process cost.

Correspondingly, in some implementations, the gate spacer 241 further covers a side wall of the floating field plate 221.

Figure 4:
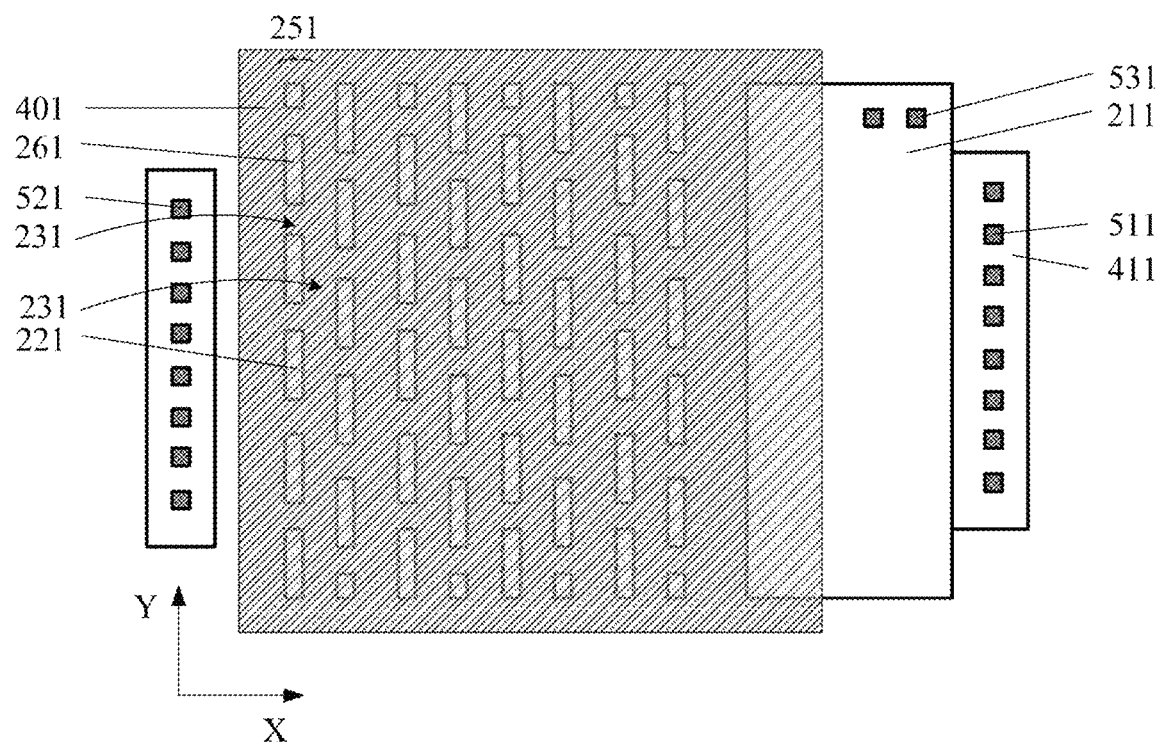

Referring to FIG. 4, in some implementations, the floating field plate 221 includes a plurality of strip-shaped structure columns 251 arranged in parallel along the width direction of the gate structure 211, each strip-shaped structure column 251 includes a plurality of strip-shaped structures 261 arranged in parallel along the length direction of the gate structure 211, and adjacent strip-shaped structures 261 are arranged in a staggered manner along the width direction of the gate structure 211.

Specifically, in some implementations, the notches 231 of the floating field plate 221 along the width direction of the gate structure 211 are surrounded by the adjacent strip-shaped structures 261 along the width direction of the gate structure 211, and the notches 231 of the floating field plate 221 along the length direction of the gate structure 211 are surrounded by the adjacent strip-shaped structures 261 along the length direction of the gate structure 211.

In some implementations, discontinuous strip-shaped structures 261 are provided along both the width direction and the length direction of the gate structure 211, which is beneficial to enabling the field plate effect of the floating field plate 221 on the surface of the base substrate 101 to be relatively uniform in both the width direction and the length direction of the gate structure 211, thereby improving the breakdown voltage of the device and guaranteeing the reliability of the device.

In other implementations, adjacent strip-shaped structures may also be aligned along the width direction of the gate structure.

Figure 5:
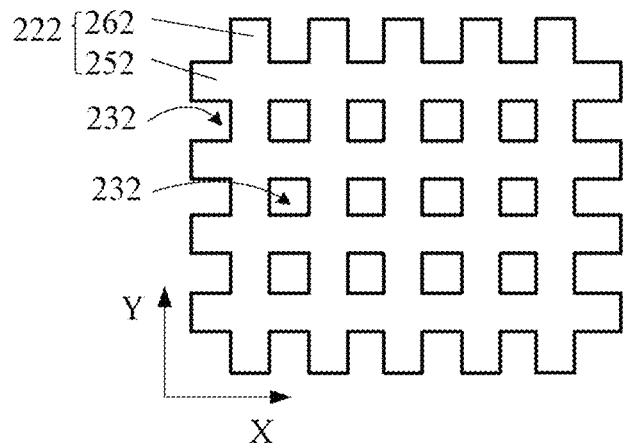
Figure 7:
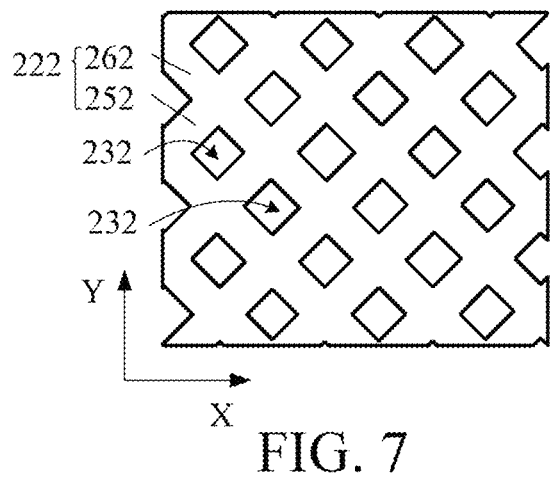

In other implementations, in combination with FIG. 5 and FIG. 7, the floating field plate 222 may further include a plurality of first strip-shaped structures 252 extending along a first direction and arranged in parallel along a second direction and a plurality of second strip-shaped structures 262 extending along the second direction and arranged in parallel along the first direction, the first strip-shaped structures 252 and the second strip-shaped structures 262 are arranged in a crossed manner, and the first direction is perpendicular to the second direction.

The first direction includes a width direction of the gate structure (as shown in FIG. 5), or a direction having an included angle of 45° with the width direction of the gate structure (as shown in FIG. 7).

Specifically, referring to FIG. 5, the notches 232 of the floating field plate 222 along the width direction of the gate structure are surrounded by the adjacent second strip-shaped structures 262 along the width direction of the gate structure, and the notches 232 of the floating field plate 222 along the length direction of the gate structure are surrounded by the adjacent first strip-shaped structures 252 along the length direction of the gate structure.

Specifically, referring to FIG. 7, both the notches 232 of the floating field plate 222 along the width direction of the gate structure and the notches 232 along the length direction of the gate structure are surrounded by two adjacent second strip-shaped structures 262 and two first strip-shaped structures 252 intersecting with each other.

Figure 6:
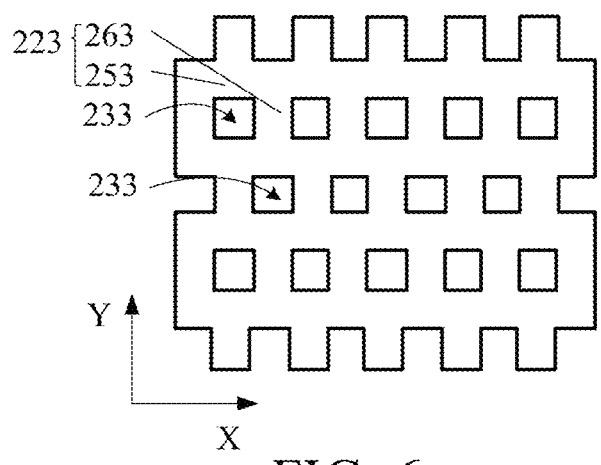

In other implementations, referring to FIG. 6, the floating field plate 223 may further include a plurality of strip-shaped structures 253 extending along the width direction of the gate structure and arranged in parallel along the length direction of the gate structure and connecting parts 263 each located in a gap 253 between adjacent strip-shaped structures and in contact with the adjacent strip-shaped structures 253, the plurality of connecting parts 263 are arranged in parallel along the width direction of the gate structure, and adjacent connecting parts 263 are arranged in a staggered manner along the length direction of the gate structure.

Specifically, the notches 233 of the floating field plate 223 in the width direction of the gate structure are surrounded by the adjacent connecting parts 263 along the width direction of the gate structure and adjacent strip-shaped structures 253 along the length direction of the gate structure, and the notches 233 of the floating field plate 223 along the length direction of the gate structure are surrounded by the adjacent strip-shaped structures 253 along the length direction of the gate structure and the adjacent connecting parts 263 along the width direction of the gate structure.

In some other implementations, the floating field plate includes a plurality of strip-shaped structures extending along the length direction of the gate structure and arranged in parallel along the width direction of the gate structure and connecting parts each located in a gap between adjacent strip-shaped structures and in contact with the adjacent strip-shaped structures, the plurality of connecting parts are arranged in parallel along the length direction of the gate structure, and the adjacent connecting parts are arranged in a staggered manner along the width direction of the gate structure.

In some implementations, the semiconductor structure further includes: a protection layer 401, located on the drift region 151 and covering the floating field plate 221.

The protection layer 401 is configured to protect the floating field plate 221 during forming of the metal silicide, to prevent the metal silicide from being formed on an undesired region (for example, the floating field plate 221).

In some implementations, along the width direction of the gate structure 211, the protection layer 401 further extends to cover part of the gate structure 211 close to the floating field plate 221.

The protection layer 401 is further configured to protect the floating field plate 221 during forming of the metal silicide, to prevent the metal silicide from being formed on an undesired region (for example, part of the gate structure 211).

Correspondingly, in some implementations, the part of the gate structure 211 covered by the protection layer 401 serves as a field plate.

In some implementations, the protection layer 401 is a metal silicide block layer (SAB) and serves as a block layer between the metal layer and silicon in a metal silicide process, thereby blocking growth of the metal silicide (Salicide) layer.

The metal silicide block layer may be one or a laminated layer of an oxide layer, a nitride layer, and an oxynitride layer. A material of the oxide layer includes silicon oxide, a material of the nitride layer includes silicon nitride, and a material of the oxynitride layer includes silicon oxynitride. In some implementations, a material of the metal silicide block layer is an oxide-nitride-oxide (oxide-nitride-oxide, ONO) structure, that is, the metal silicide block layer includes a silicon oxide layer, a silicon nitride layer, and a silicon oxide layer sequentially laminated from bottom to top. It should be noted that: a material of the silicide block layer may also include another suitable material, for example: a carbon-doped silicon nitride or the like.

In some implementations, the semiconductor structure further includes: an inter-layer dielectric layer 501, covering surfaces of the gate structure 211, the protection layer 401, and the base substrate 101.

The inter-layer dielectric layer 501 is configured to implement electric isolation between conductive structures and implement electric isolation between the conductive structures and other electric connection structures, and the inter-layer dielectric layer 501 is further configured to implement electric isolation between adjacent devices.

A material of the inter-layer dielectric layer 501 is an insulating material. In some implementations, a material of the inter-layer dielectric layer 501 is silicon oxide. In other implementations, the material of the inter-layer dielectric layer may alternatively be another dielectric material such as silicon nitride or silicon oxynitride.

In some implementations, a doped layer below the floating field plate 221 and a top portion of the inter-layer dielectric layer 501 above the floating field plate 221 can form a capacitor, and a dielectric coefficient of the material of the floating field plate 221 is less than a dielectric coefficient the inter-layer dielectric layer 501, which is equivalent to adjusting a dielectric between capacitor plates and reducing the dielectric coefficient of the dielectric, thereby being beneficial to reducing the electric field strength on the surface of the isolation layer 171 and increasing the breakdown voltage of the LDMOS device, further improving the electrical properties of the LDMOS devices.

In some implementations, the semiconductor structure further includes: a drain region contact 521, passing through the inter-layer dielectric layer 501 on a top portion of the drain region 181 and in contact with a top surface of the drain region 181.

The drain region contact 521 is configured to implement an electric connection between the drain region 181 and another interconnection structure or an external circuit.

In some implementations, the semiconductor structure further includes: a source region contact 511, passing through the inter-layer dielectric layer 501 on a top portion of the source region 191 and in contact with a top surface of the source region 191.

The source region contact 511 is configured to implement an electric connection between the source region 191 and another interconnection structure or an external circuit.

In some implementations, the semiconductor structure further includes: a gate contact 531, passing through the inter-layer dielectric layer 501 on a top portion of the gate structure 211 and in contact with a top surface of the gate structure 211.

It should be noted that: the gate contact 531 does not have a cross section at a same cross section as the drain region contact 521 or the source region contact 511, and therefore an outline of the gate contact 531 is depicted by a dashed line in FIG. 3.

In some implementations, the gate contact 531, the drain region contact 521, and the source region contact 511 are all contact hole contacts (Contact).

In some implementations, materials of the gate contact 531, the drain region contact 521, and the source region contact 511 are the same, including one or more of W, Al, Cu, Ag, and Au.

In some implementations, the semiconductor structure further includes: a drain region field plate 551, located on the inter-layer dielectric layer 501 and in contact with the drain region contact 521, where the drain region field plate 551 extends from a position above the drain region 181 to a position above an edge portion, of the drift region 151, close to the drain region 181.

The drain region field plate 551 serves as a field plate and the drain region field plate 551 extends from a position above the drain region 181 to a position above an edge portion of the drift region 151 close to the drain region 181. The edge portion of the drift region 151 close to the drain region 181 and the drain region field plate 551 can be regarded as forming a capacitor. The drain region field plate 551 is beneficial to increasing the electric field strength of the edge portion of the drift region 151 close to the drain region 181, alleviating the rapid change in the electric field from the drain region 181 to an edge of the isolation layer 171, and enhancing the reliability of the device.

In some implementations, the semiconductor structure further includes: a source region field plate 541, located on the inter-layer dielectric layer 501 and in contact with the source region contact 511, where the source region field plate 541 extends from a position above the source region 191 to a position above an edge portion, of the drift region 151, close to the body region 141.

The source region field plate 541 serves as a field plate and the source region field plate 541 extends from a position above the source region 191 to a position above an edge portion of the drift region 151 close to the body region 141. The edge portion of the drift region 151 close to the body region 141 and the source region field plate 541 can be regarded as forming a capacitor. The source region field plate 541 is beneficial to increasing the electric field strength of the edge portion of the drift region 151 close to the body region 141, alleviating the rapid change in the electric field from the body region 141 to an edge of the isolation layer 171, and enhancing the reliability of the device.

In some implementations, both the drain region field plate 551 and the source region field plate 541 are metal materials, including one or more of W, Al, Cu, Ag, and Au.

In some implementations, the semiconductor further includes: a metal silicide layer 411, located on a surface of the drain region 181, surfaces of the source region 191 and the body contact region 301, and a surface of the gate structure 211 exposed out of the protection layer 401.

Specifically, in some implementations, the gate contact 531, the drain region contact 521, and the source region contact 511 are respectively in contact with the metal silicide layer 411 on a corresponding device structure.

The metal silicide layer 411 is configured to improve adhesion between the gate contact 531 and the gate structure 211, between the source region contact 511 and the source region 191, and between the drain region contact 521 and the drain region 181, and to reduce contact resistance between the gate contact 531 and the gate structure 211, between the source region contact 511 and the source region 191, and between the drain region contact 521 and the drain region 181.

In some implementations, a material of the metal silicide layer 411 may be a material such as TiSi, NiSi, or CoSi. FIG. 8 to FIG. 18 are schematic structural diagrams corresponding to steps of a method for forming a semiconductor structure according to an embodiment of the present disclosure.

Figure 8:
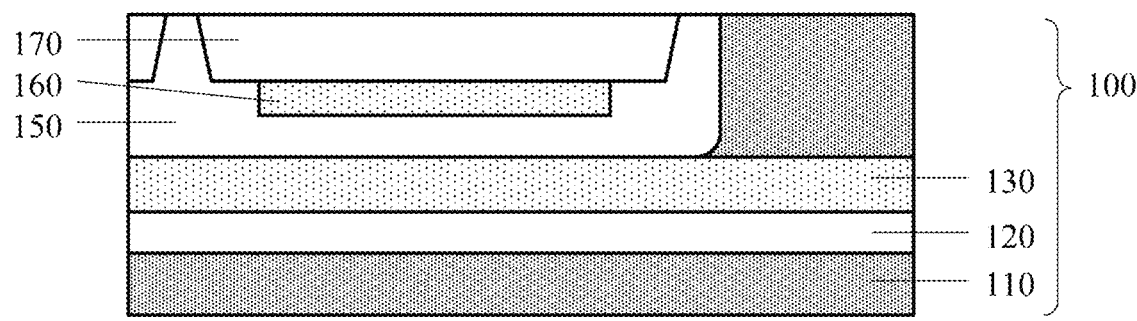
FIG. 8 to FIG. 18 are schematic structural diagrams corresponding to steps of one form of a method for forming a semiconductor structure according to the present disclosure.

Referring to FIG. 8, provided is a base substrate 100, in which a drift region 150 is formed.

The semiconductor structure is an LDMOS transistor, and the LDMOS transistor may be an N-type transistor or a P-type transistor.

The base substrate 100 is configured to provide a process platform for forming the semiconductor structure. In some implementations, the base substrate 100 includes a substrate 110.

A material of the substrate 110 is silicon. In other implementations, the material of the substrate may alternatively be germanium, silicon carbide, silicon germanide, gallium arsenide, indium gallide, or silicon on an insulator.

In some implementations, for example, the LDMOS device is an N-type device, the substrate 110 is a P-type substrate (P-type Substrate), and the substrate 110 is doped with P-type ions. In other implementations, in a case that the LDMOS device is a P-type device, the substrate is an N-type substrate, and correspondingly, the substrate is doped with N-type ions.

In some implementations, the base substrate 100 further includes other types of device regions, for example: a core region (not shown) for forming a core device (Core device) and a peripheral region (not shown) for forming an input/output device (Input/Output device, I/O device).

The core device mainly refers to a device used in a chip, typically using a relatively low voltage and a relatively high working frequency. The input/output device typically refers to a device used when a chip interacts with an external interface. A working voltage of such type of devices is generally high, and the working voltage of the input/output device is typically greater than the working voltage of the core device, and a working frequency of the input/output device is typically less than the working frequency of the core device.

In some implementations, in the step of providing the base substrate 100, the base substrate 100 further includes a buried layer 120 located on the substrate 110, and a type of ions doped in the buried layer 120 is opposite to a type of ions doped in the substrate 110.

In some implementations, the buried layer 120 is an N-type ion implantation buried layer and is configured to form an isolation structure between the substrate 110 and a device above.

In some implementations, in the step of providing the base substrate 100, the base substrate 100 further includes an epitaxial isolation layer 130 located on the buried layer 120, and a type of ions doped in the epitaxial isolation layer 130 is opposite to a type of ions doped in the buried layer 120.

In some implementations, the epitaxial isolation layer 130 is a P-type ion epitaxial isolation layer and is configured to isolate the buried layer 120 and the device located on the epitaxial isolation layer 130, and together with the buried layer 120, form an isolation structure between the substrate 110 and the device above.

The drift region 150 facilitates in improving a breakdown voltage between subsequently formed source region and drain region and in reducing a parasitic capacitance between the source region and the drain region, which is conducive to improving the frequency characteristics. In addition, the drift region serves as a buffer between the channel and the drain region, which is beneficial to weakening the short-channel effect of the LDMOS device.

A doping type of the drift region 150 is P-type doping or N-type doping. In some implementations, the LDMOS device is an N-type device, and correspondingly, the doping type of the drift region 150 is N-type doping, and doped ions for the N-type doping are P, As, or Sb.

The drift region 150 is a high-resistance region, so a concentration of ions doped in the drift region 150 is small, and the concentration of ions doped in the drift region 150 is less than a concentration of ions doped in the drain region, which is equivalent to forming a high-resistance layer between the source region and the drain region, so that the breakdown voltage can be increased, the parasitic capacitance between the source region and the drain region can be reduced, and the frequency characteristics can be improved.

In some implementations, in the step of providing the base substrate 100, an isolation layer 170 is further formed in the drift region 150 between the gate structure 211 and the drain region 180.

For example, in some implementations, the isolation layer 170 is a shallow trench isolation structure.

For an LDMOS transistor, the drain region needs to withstand a high voltage, and a hot carrier injection (HCI) effect is relatively significant. The isolation layer 170 is configured to alleviate the hot carrier injection effect and further improve a breakdown voltage of the LDMOS transistor. In some implementations, a material of the isolation layer 170 is silicon oxide. In other implementations, the material thereof may alternatively be another dielectric material such as silicon nitride or silicon oxynitride.

In some implementations, the isolation layer 170 further serves as a field plate (field plate). During working of the device, a current between the drain region and the source region flows along a bottom portion of the isolation layer 170, which reduces an electric field strength on a surface of the device and improves the breakdown voltage of the device.

In some implementations, in the step of providing the base substrate 100, a reverse type ion implantation region 160 is further formed in the drift region 150 below the isolation layer 170, and a type of ions of the reverse type ion implantation region 160 is opposite to that of the drift region 150.

In some implementations, the LDMOS device is an N-type device, and correspondingly, the doping type of the reverse type ion implantation region 160 is P-type doping, and doped ions for the P-type doping are B, Ga, or In.

In some implementations, the reverse type ion implantation region 160 serves as a field plate. During working of the device, a flow depth of a current between the drain region and the source region is further increased and a resistance between the source region and the drain region can also be increased, which reduce an electric field strength on a surface of the device and improve the breakdown voltage of the device.

Figure 9:
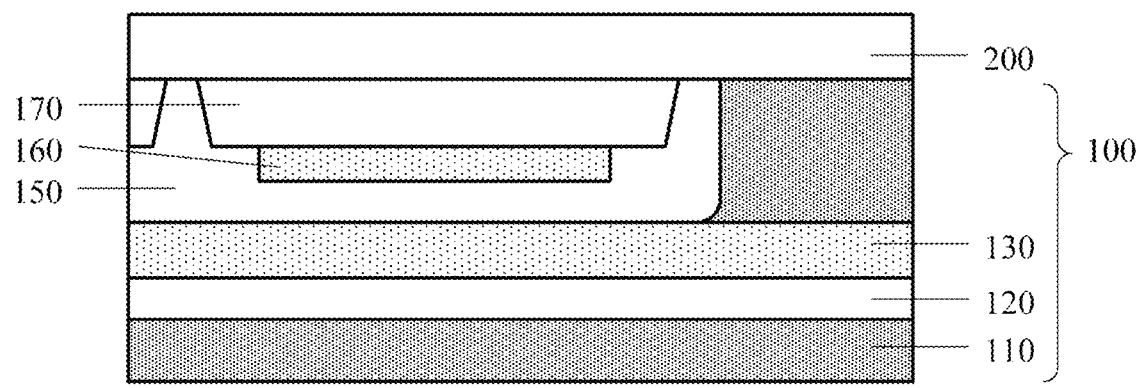
Figure 10:
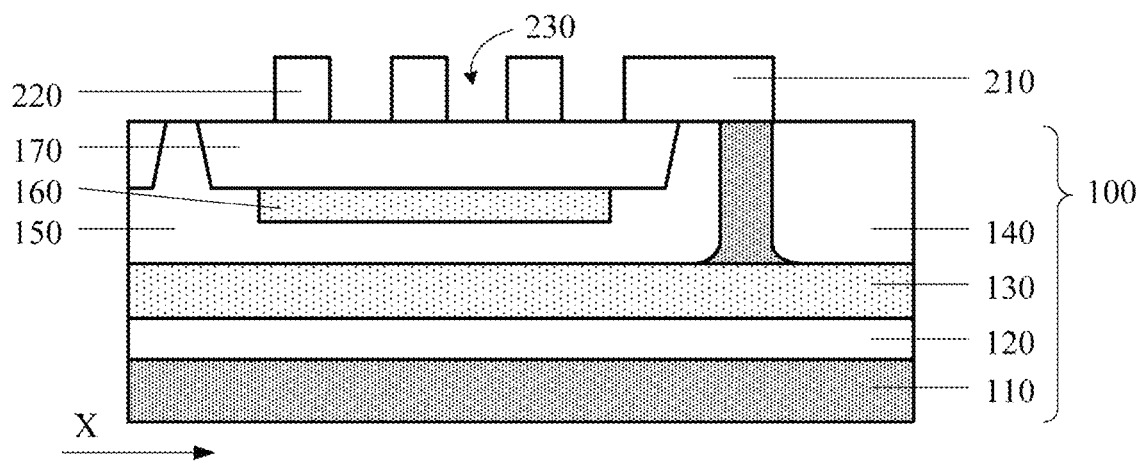

In combination with FIG. 9 to FIG. 14, FIG. 11 to FIG. 14 are top views of FIG. 10, a gate structure 210 is formed on a base substrate 100, and the gate structure 210 spans to cover part of a top portion of a drift region 150.

During working of the device, the gate structure 210 is configured to control on or off of a conductive channel.

The gate structure 210 includes a gate dielectric layer (not shown) and a gate electrode layer (not shown) on a surface of the gate dielectric layer.

A material of the gate dielectric layer is silicon oxide, silicon nitride, or silicon oxynitride. A material of the gate dielectric layer may alternatively be a high-k gate dielectric material, for example, $HfO_2$ or $Al_2O_3$.

In some implementations, a material of the gate structure 210 is polysilicon.

Figure 11:
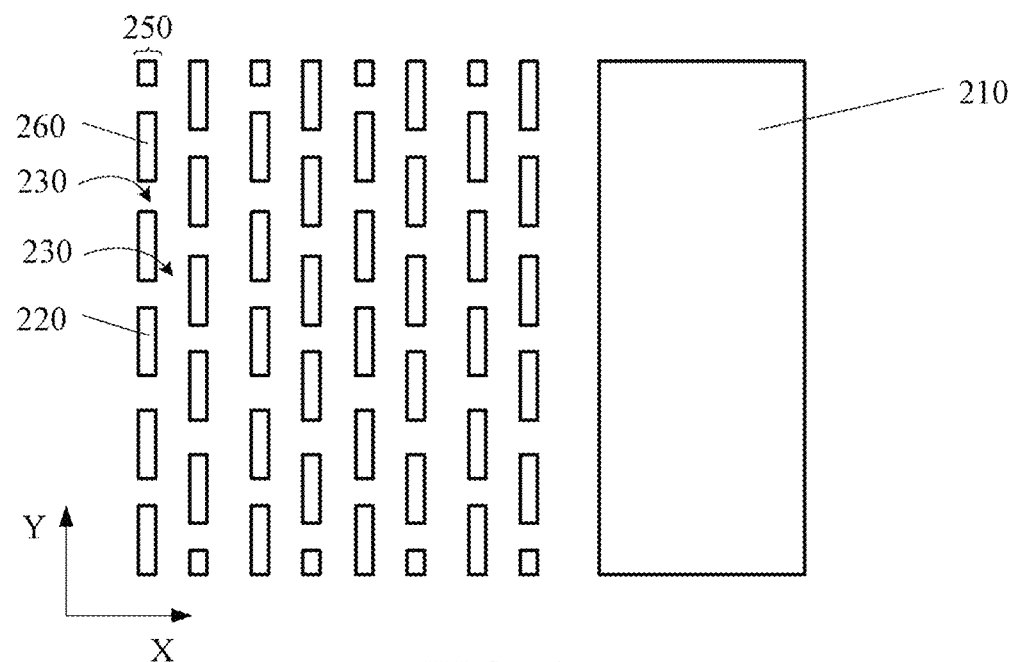

Further referring to FIG. 9 and FIG. 10, the floating field plate 220 is formed on the drift region 150 on one side of the gate structure 210, the floating field plate 220 has notches 230 arranged at intervals along the width direction of the gate structure 210 (indicated by the X direction in FIG. 10), and the floating field plate 230 also has notches 230 arranged at intervals along the length direction of the gate structure (indicated by the Y direction in FIG. 11).

In some implementations, since the floating field plate 220 has notches 230 arranged at intervals along the width direction of the gate structure 210 and the floating field plate 220 also has notches 230 arranged at intervals along the length direction of the gate structure 210, the floating field plate 220 has discontinuous structures along both the width direction and the length direction of the gate structure 210, which is beneficial to reducing an electric field between the gate structure 210 and the drain region by using a field plate effect of the floating field plate 220, so as to enable the field plate effect of the floating field plate 220 on the surface of the base substrate 100 to be relatively uniform while improving a breakdown voltage of the device, so that a reduction in the reliability of the device caused by a rapid change in the electric field at an edge of a floating field plate due to use of a floating field plate having a large continuous structure is avoided. Hence, this embodiment is beneficial to guaranteeing the reliability of the device while improving the breakdown voltage of the device.

It should be noted that: the width direction of the gate structure 210 is a channel length direction, that is, a subsequent direction in which the drain points to the source, and the length direction of the gate structure 210 is a channel width direction, that is, a direction perpendicular to a direction in which the drain points to the source.

In some implementations, the floating field plate 220 is formed on the isolation layer 170, so as to reduce the electric field strength on a surface of the isolation layer 170 and improve the breakdown voltage of the device.

It should be noted that: In some implementations, the floating field plate 220 is located in a middle region of the isolation layer 170, which is beneficial to preventing impact on the reliability of the device caused by a rapid change in an electric field at a junction between the isolation layer 170 and the drain region 181 resulted from a reduction in the electric field of the isolation layer 170 close to the drain region 181 due to an excessively large electric field at the junction between the isolation layer 170 and the drain region 181 caused by an excessively short boundary distance between the floating field plate 220 and the isolation layer 170.

In some implementations, a material of the floating field plate 220 includes polysilicon.

The use of polysilicon to form the floating field plate 220 is beneficial to obtaining a suitable dielectric constant, reducing the electric field strength on the surface of the isolation layer 170, increasing the breakdown voltage of the LDMOS device, and further improving the electrical properties of the LDMOS device.

Referring to FIG. 11, in some implementations, the floating field plate 220 includes a plurality of strip-shaped structure columns 250 arranged in parallel along the width direction of the gate structure 210, each strip-shaped structure column 250 includes a plurality of strip-shaped structures 260 arranged in parallel along the length direction of the gate structure 210, and adjacent strip-shaped structures 260 are arranged in a staggered manner along the width direction of the gate structure 210.

Specifically, in some implementations, the notches 231 of the floating field plate 220 along the width direction of the gate structure 210 are surrounded by the adjacent strip-shaped structures 260 along the width direction of the gate structure 210, and the notches 231 of the floating field plate 220 along the length direction of the gate structure 210 are surrounded by the adjacent strip-shaped structures 260 along the length direction of the gate structure 210.

In some implementations, discontinuous strip-shaped structures 260 are provided along both the width direction and the length direction of the gate structure 210, which is beneficial to enabling the field plate effect of the floating field plate 220 on the surface of the base substrate 100 to be relatively uniform in both the width direction and the length direction of the gate structure 210, thereby improving the breakdown voltage of the device and guaranteeing the reliability of the device.

In other implementations, adjacent strip-shaped structures may also be aligned along the width direction of the gate structure.

Figure 12:
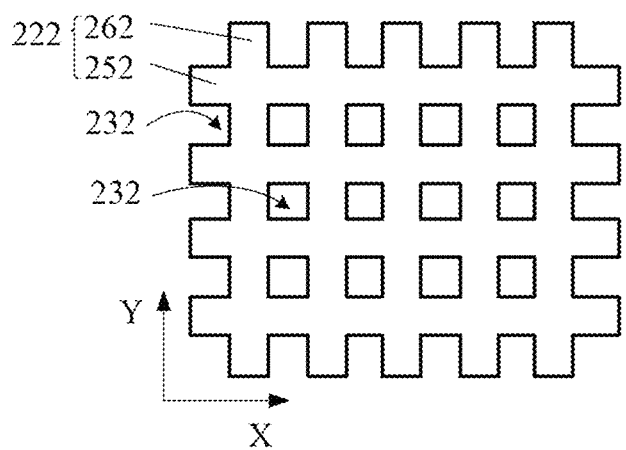
Figure 14:
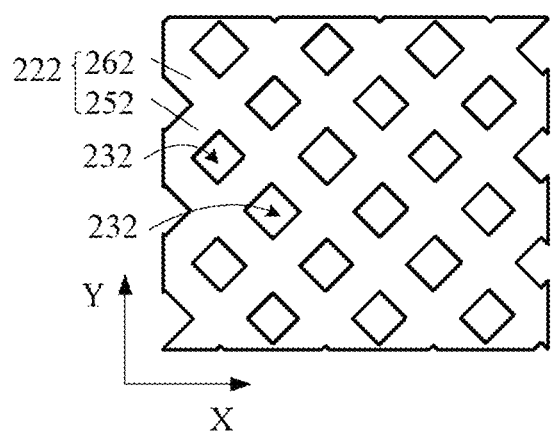

In other implementations, in combination with FIG. 12 and FIG. 14, the floating field plate 222 may further include a plurality of first strip-shaped structures 252 extending along a first direction and arranged in parallel along a second direction and a plurality of second strip-shaped structures 262 extending along the second direction and arranged in parallel along the first direction, the first strip-shaped structures 252 and the second strip-shaped structures 262 are arranged in a crossed manner, and the first direction is perpendicular to the second direction.

The first direction includes a width direction of the gate structure (as shown in FIG. 12), or a direction having an included angle of 45° with the width direction of the gate structure (as shown in FIG. 14).

Specifically, referring to FIG. 12, the notches 232 of the floating field plate 222 along the width direction of the gate structure are surrounded by the adjacent second strip-shaped structures 262 along the width direction of the gate structure, and the notches 232 of the floating field plate 222 along the length direction of the gate structure are surrounded by the adjacent first strip-shaped structures 252 along the length direction of the gate structure.

Specifically, referring to FIG. 14, both the notches 232 of the floating field plate 222 along the width direction of the gate structure and the notches 232 along the length direction of the gate structure are surrounded by two adjacent second strip-shaped structures 262 and two first strip-shaped structures 252 intersecting with each other.

Figure 13:
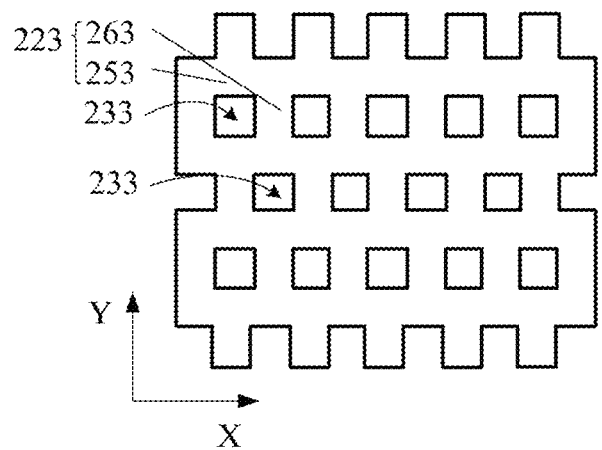

In other implementations, referring to FIG. 13, the floating field plate 223 may further include a plurality of strip-shaped structures 253 extending along the width direction of the gate structure and arranged in parallel along the length direction of the gate structure and connecting parts 263 each located in a gap 253 between adjacent strip-shaped structures and in contact with the adjacent strip-shaped structures 253, the plurality of connecting parts 263 are arranged in parallel along the width direction of the gate structure, and adjacent connecting parts 263 are arranged in a staggered manner along the length direction of the gate structure.

Specifically, the notches 233 of the floating field plate 223 in the width direction of the gate structure are surrounded by the adjacent connecting parts 263 along the width direction of the gate structure and adjacent strip-shaped structures 253 along the length direction of the gate structure, and the notches 233 of the floating field plate 223 along the length direction of the gate structure are surrounded by the adjacent strip-shaped structures 253 along the length direction of the gate structure and the adjacent connecting parts 263 along the width direction of the gate structure.

In some other implementations, the floating field plate includes a plurality of strip-shaped structures extending along the length direction of the gate structure and arranged in parallel along the width direction of the gate structure and connecting parts each located in a gap between adjacent strip-shaped structures and in contact with the adjacent strip-shaped structures, the plurality of connecting parts are arranged in parallel along the length direction of the gate structure, and the adjacent connecting parts are arranged in a staggered manner along the width direction of the gate structure.

In some implementations, the gate structure 210 and the floating field plate 220 are formed in one same step.

The material of the floating field plate 220 is the same as the material of the gate structure 210, which is beneficial to also forming the floating field plate 220 in the step of forming the gate structure 210, so that a forming process of the floating field plate 220 is compatible with a forming process of the gate structure 210, and that the floating field plate 220 can be formed without adding an additional step, thereby improving the process efficiency and saving the process cost.

Specifically, referring to FIG. 9, in some implementations, the step of forming a gate structure 210 and a floating field plate 220 includes: forming a gate material layer 200 covering the base substrate 100.

The gate material layer 200 is configured to form the gate structure 210 and the floating field plate 220.

Correspondingly, in some implementations, a material of the gate material layer 200 is polysilicon.

Referring to FIG. 10, the gate material layer 200 is patterned, to retain part of the gate material layer 200 that spans to cover a top portion of the drift region 150 as the gate structure 210 and to retain part of the gate material layer 200 on the drift region 150 on the side of the gate structure 210 as the floating field plate 210.

Figure 15:
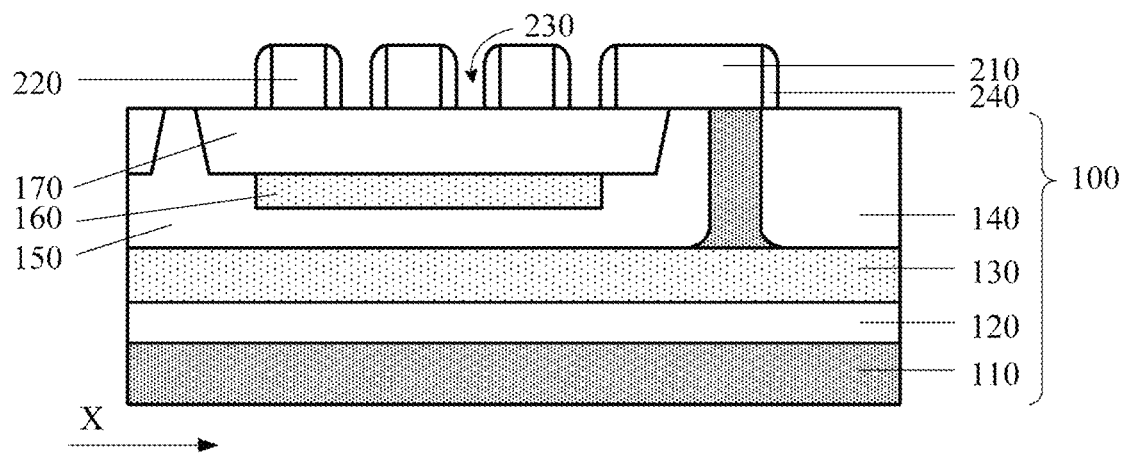

Referring to FIG. 15, the method for forming a semiconductor structure further includes: forming a gate spacer 240 covering a side wall of the gate structure 210.

The gate spacer 240 protects the side wall of the gate structure 210, and the gate spacer 240 also subsequently defines a position of a source region.

A material of the gate spacer 240 may be one or more of silicon oxide, silicon nitride, silicon carbide, silicon carbonitride, silicon oxycarbonitride, silicon oxynitride, boron nitride, and boron carbonitride, and the gate spacer 240 may be a single-layer structure or a laminated structure. In some implementations, the gate spacer 240 is a single-layer structure and is made of silicon nitride.

In some implementations, the step of forming the gate spacer 240 includes: forming a spacer material layer covering a top portion and a side wall of the gate structure 210, a top of the base substrate 100, and a top portion and a side wall of the floating field plate 220; and removing the spacer material layer from the top portion of the gate structure 210, the top portion of the base substrate 100, and the top portion of the floating field plate 220, to retain the spacer material layer on the side wall of the gate structure 210 and the side wall of the floating field plate 220 as the gate spacer 240.

Therefore, in some implementations, the gate spacer 240 further covers the side wall of the floating field plate 220.

Further referring to FIG. 15, a body region 140 is formed in the base substrate 100 on a side of the gate structure 210 facing away from the drift region 150.

The body region 140 is configured to form a conductive channel having a concentration gradient. Specifically, the part of the body region 140 covered by the gate structure 211 serves as an effective channel region.

A doping type of the body region 140 is N-type doping or P-type doping, and the doping type the body region 140 is different from a doping type the drift region 150. In some implementations, the doping type of the body region 140 is P-type doping, and doped ions for the P-type doping are B, Ga, or In.

In other implementations, a body region may also be formed in the base substrate on one side of the drift region before forming the gate structure.

In some implementations, the gate structure 210 intersects with surfaces of the drift region 150 and the body region 140, so that part of the body region 130 covered by the gate structure 210 and the substrate 110 located between the drift region 150 and the body region 140 serves as an effective channel region.

Figure 16:
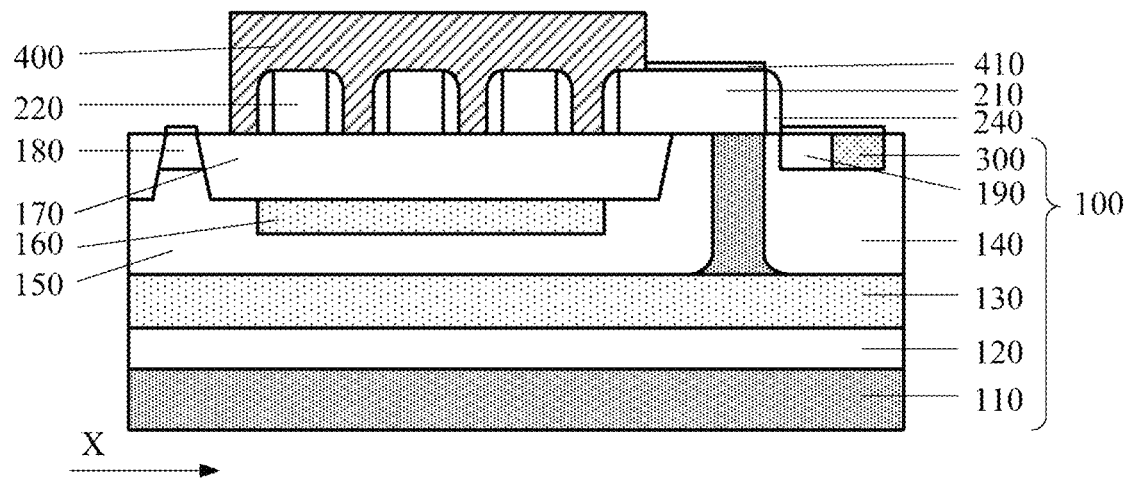

Referring to FIG. 16, after the source region and drain region are subsequently formed, the forming method further includes: forming a protection layer 400 on the drift region 150 to cover the floating field plate 220.

The protection layer 400 is configured to protect the floating field plate 220 during forming of the metal silicide, to prevent the metal silicide from being formed on an undesired region (for example, the floating field plate 220).

In some implementations, in the step of forming the protection layer 400, the protection layer 400 further extends to cover part of the gate structure 210 close to the floating field plate 220.

The protection layer 400 is further configured to protect the floating field plate 220 during forming of the metal silicide, to prevent the metal silicide from being formed on an undesired region (for example, part of the gate structure 210).

Correspondingly, in some implementations, the part of the gate structure 210 covered by the protection layer 400 serves as a field plate.

In some implementations, the protection layer 400 is a metal silicide block layer (SAB) and serves as a block layer between the metal layer and silicon in a metal silicide process, thereby blocking growth of the metal silicide (Salicide) layer.

The metal silicide block layer may be one or a laminated layer of an oxide layer, a nitride layer, and an oxynitride layer. A material of the oxide layer includes silicon oxide, a material of the nitride layer includes silicon nitride, and a material of the oxynitride layer includes silicon oxynitride. In some implementations, a material of the metal silicide block layer is an oxide-nitride-oxide (oxide-nitride-oxide, ONO) structure, that is, the metal silicide block layer includes a silicon oxide layer, a silicon nitride layer, and a silicon oxide layer sequentially laminated from bottom to top. It should be noted that: a material of the silicide block layer may also include another suitable material, for example: a carbon-doped silicon nitride or the like.

Further referring to FIG. 16, a drain region 180 is formed in the drift region 150 on one side of the gate structure 210; and a source region 190 is formed in the body region 140 on the other side of the gate structure 210.

The drain region 180 serves as a drain terminal of the LDMOS transistor. In some implementations, the base substrate 100 is exposed out of a surface of the drain region 180, and the drain region 180 has N-type doped ions. The drain region 180 and the gate structure 210 are separated by a lateral distance to improve the voltage tolerance performance of the LDMOS transistor. That the drain region 180 and the gate structure 210 are separated by a lateral distance refers to: in a direction perpendicular to the side wall of the gate structure 210, the drain region 180 is located on the side of the gate structure 210 and is isolated from the gate structure 210.

The source region 190 serves as a source terminal of the LDMOS transistor. A doping type the source region 190 is the same as a doping type of the drain region 180, and a concentration of ions doped in the source region 190 is the same as a concentration of ions doped in the drain region 180.

In some implementations, a body contact region 300 is also formed in the body region 140 on a side of the source region 190 away from the gate structure 210, and a side wall of the body contact region 300 is in contact with a side wall of the source region 190. The body region 140 is circumscribed through the body contact region 300. The body contact region 300 has P-type doped ions, and a concentration of ions doped in the body contact region 300 is greater than a concentration of ions doped in the body region 140, so that a resistance of the body contact region 300 is relatively small.

Further referring to FIG. 16, the method for forming a semiconductor structure further includes: forming a metal silicide layer 410 on a surface of the drain region 180, surfaces of the source region 190 and the body contact region 301, and a surface of the gate structure 210 exposed out of the protection layer 400.

The metal silicide layer 410 is configured to improve adhesion between the gate contact 530 and the gate structure 210, between the source region contact 510 and the source region 190, and between the drain region contact 520 and the drain region 180, and to reduce contact resistance between the gate contact 530 and the gate structure 210, between the source region contact 510 and the source region 190, and between the drain region contact 520 and the drain region 180.

Figure 17:
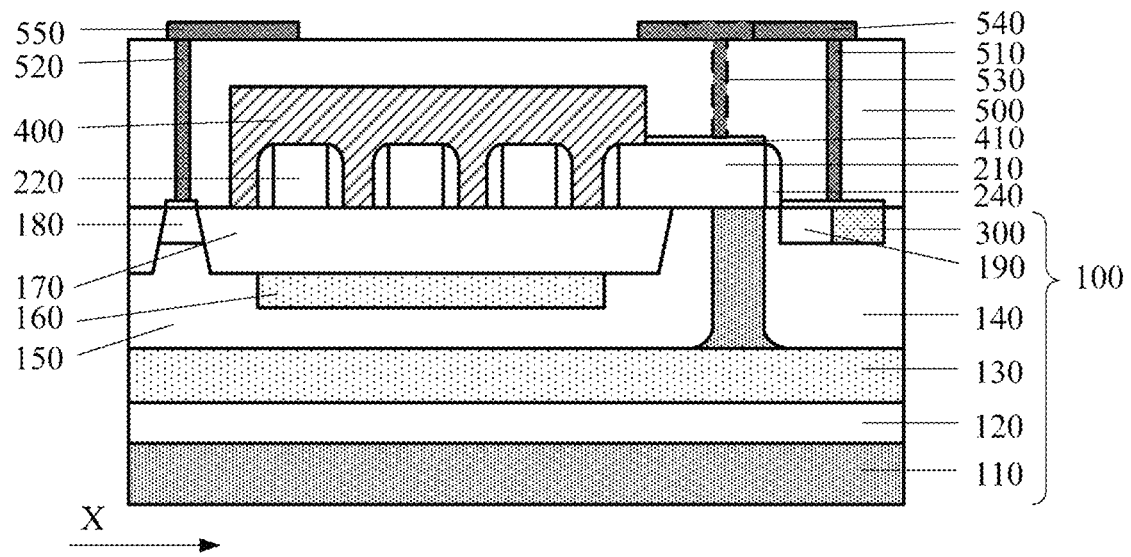
Figure 18:
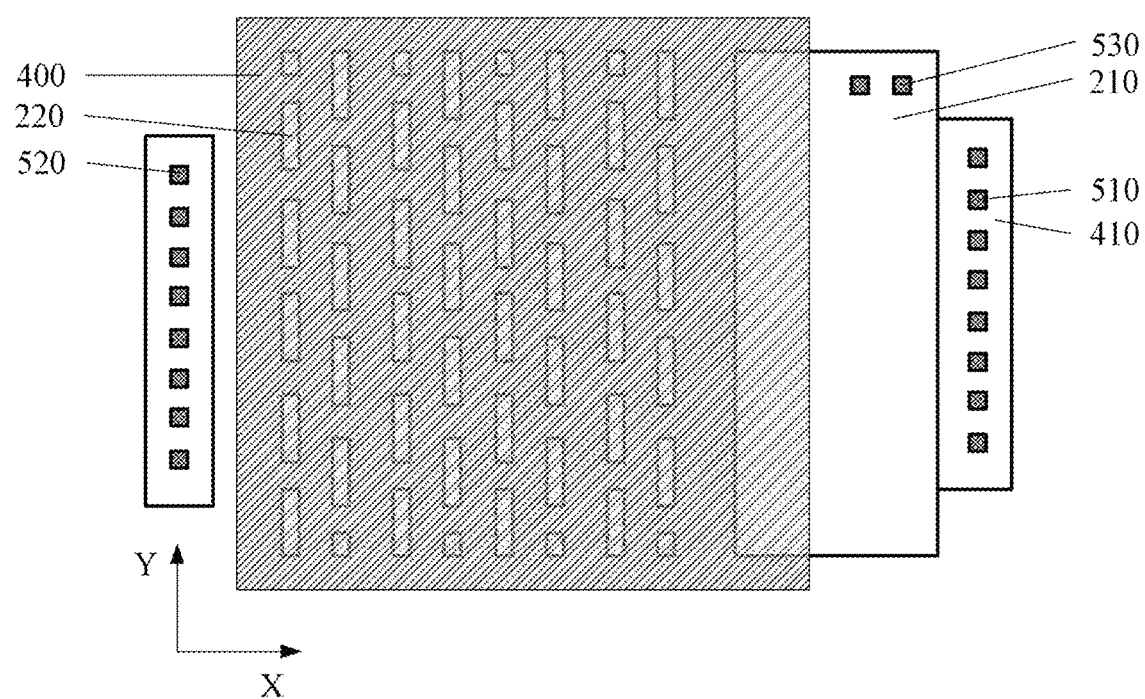

In some implementations, a material of the metal silicide layer 410 may be a material such as TiSi, NiSi, or CoSi. In combination with FIG. 17 and FIG. 18, FIG. 18 is a top view of FIG. 17, after the protection layer 400 located on the drift region 150 and covering the floating field plate 220 is formed, the forming method further includes: forming an inter-layer dielectric layer 500 to cover the gate structure 210, the protection layer 400, and a surface of the base substrate 100.

The inter-layer dielectric layer 500 is configured to implement electric isolation between conductive structures and implement electric isolation between the conductive structures and other electric connection structures, and the inter-layer dielectric layer 500 is further configured to implement electric isolation between adjacent devices.

A material of the inter-layer dielectric layer 500 is an insulating material. In some implementations, a material of the inter-layer dielectric layer 500 is silicon oxide. In other implementations, the material of the inter-layer dielectric layer may alternatively be another dielectric material such as silicon nitride or silicon oxynitride.

In some implementations, a doped layer below the floating field plate 220 and a top portion of the inter-layer dielectric layer 500 above the floating field plate 220 can form a capacitor, and a dielectric coefficient of the material of the floating field plate 220 is less than a dielectric coefficient the inter-layer dielectric layer 500, which is equivalent to adjusting a dielectric between capacitor plates and reducing the dielectric coefficient of the dielectric, thereby being beneficial to reducing the electric field strength on the surface of the isolation layer 170 and increasing the breakdown voltage of the LDMOS device, further improving the electrical properties of the LDMOS devices.

In some implementations, after the inter-layer dielectric layer 500 is formed, the forming method further includes: forming a drain region contact 520 passing through the inter-layer dielectric layer 500 on a top portion of the drain region 180 and in contact with the top surface of the drain region 180, where the drain region contact 520 is configured to electrically connect the drain region 180 to another interconnect structure or an external circuit.

In some implementations, the forming method further includes: forming a source region contact 510 passing through the inter-layer dielectric layer 500 on a top portion of the source region 190 and in contact with a top surface of the source region 190.

The source region contact 510 is configured to implement an electric connection between the source region 190 and another interconnection structure or an external circuit.

In some implementations, the forming method further includes: forming a gate contact 530 passing through the inter-layer dielectric layer 500 on a top portion of the gate structure 210 and in contact with a top surface of the gate structure 210.

It should be noted that: the gate contact 530 does not have a cross section at a same cross section as the drain region contact 520 or the source region contact 510, and therefore an outline of the gate contact 530 is depicted by a dashed line in FIG. 17.

In some implementations, the gate contact 530, the drain region contact 520, and the source region contact 510 are all contact hole contacts (Contact).

In some implementations, materials of the gate contact 530, the drain region contact 520, and the source region contact 510 are the same, including one or more of W, Al, Cu, Ag, and Au.

Specifically, in some implementations, the gate contact 530, the drain region contact 520, and the source region contact 510 are respectively in contact with the metal silicide layer 410 on a corresponding device structure.

In some implementations, the forming method further includes: forming, on the inter-layer dielectric layer 500, a drain region field plate 550 in contact with the drain region contact 520, where the drain region field plate 550 extends from a position above the drain region 180 to a position above an edge portion of the drift region 150 close to the drain region 180.

The drain region field plate 550 serves as a field plate and the drain region field plate 550 extends from a position above the drain region 180 to a position above an edge portion of the drift region 150 close to the drain region 180. The edge portion of the drift region 150 close to the drain region 180 and the drain region field plate 550 can be regarded as forming a capacitor. The drain region field plate 550 is beneficial to increasing the electric field strength of the edge portion of the drift region 150 close to the drain region 180, alleviating the rapid change in the electric field from the drain region 180 to an edge of the isolation layer 170, and enhancing the reliability of the device.

In some implementations, the forming method further includes: forming, on the inter-layer dielectric layer 500, a source region field plate 540 in contact with the source region contact 510, where the source region field plate 540 extends from a position above the source region 190 to a position above an edge portion of the drift region 150 close to the body region 140.

The source region field plate 540 serves as a field plate and the source region field plate 540 extends from a position above the source region 190 to a position above an edge portion of the drift region 150 close to the body region 140. The edge portion of the drift region 150 close to the body region 140 and the source region field plate 540 can be regarded as forming a capacitor. The source region field plate 540 is beneficial to increasing the electric field strength of the edge portion of the drift region 150 close to the body region 140, alleviating the rapid change in the electric field from the body region 140 to an edge of the isolation layer 170, and enhancing the reliability of the device.

In some implementations, both the drain region field plate 550 and the source region field plate 540 are metal materials, including one or more of W, Al, Cu, Ag, and Au.

Although the present disclosure is disclosed above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A semiconductor structure, comprising:
   a base substrate;
   a gate structure, located on the base substrate;
   a drift region, located in the base substrate on a first side of the gate structure;
   a body region, located in the base substrate on a second side of the gate structure;
   a drain region, located in the drift region on the first side of the gate structure;
   a source region, located in the body region on the second side of the gate structure; and
   a floating field plate, located on the drift region between the gate structure and the drain region, wherein the floating field plate has notches arranged at intervals along a width direction of the gate structure, and the floating field plate has notches arranged at intervals along a length direction of the gate structure.

2. The semiconductor structure according to claim 1, wherein the semiconductor structure further comprises: an isolation layer, located in the drift region between the gate structure and the drain region, wherein the floating field plate is located on the isolation layer.

3. The semiconductor structure according to claim 2, wherein the semiconductor structure further comprises: a reverse type ion implantation region, located in the drift region below the isolation layer, wherein a type of ions of the reverse type ion implantation region is opposite to that of the drift region.

4. The semiconductor structure according to claim 1, wherein the semiconductor structure further comprises: a protection layer, located on the drift region and covering the floating field plate.

5. The semiconductor structure according to claim 4, wherein along the width direction of the gate structure, the protection layer further extends to cover part of the gate structure close to the floating field plate.

6. The semiconductor structure according to claim 4, wherein the semiconductor structure further comprises: an inter-layer dielectric layer, covering surfaces of the gate structure, the protection layer, and the base substrate.

7. The semiconductor structure according to claim 6, wherein the semiconductor structure further comprises:
 a drain region contact, passing through the inter-layer dielectric layer on a top portion of the drain region and in contact with a top surface of the drain region; and
 a drain region field plate, located on the inter-layer dielectric layer and in contact with the drain region contact, wherein the drain region field plate extends from a position above the drain region to a position above an edge portion, of the drift region, close to the drain region.

8. The semiconductor structure according to claim 6, wherein the semiconductor structure further comprises:
 a source region contact, passing through the inter-layer dielectric layer on a top portion of the source region and in contact with a top surface of the source region; and
 a source region field plate, located on the inter-layer dielectric layer and in contact with the source region contact, wherein the source region field plate extends from a position above the source region to a position above an edge portion, of the drift region, close to the body region.

9. The semiconductor structure according to claim 6, wherein the semiconductor structure further comprises: a gate contact, passing through the inter-layer dielectric layer on a top portion of the gate structure and in contact with a top surface of the gate structure.

10. The semiconductor structure according to claim 6, wherein a dielectric coefficient of a material of the floating field plate is less than a dielectric coefficient of the inter-layer dielectric layer.

11. The semiconductor structure according to claim 1, wherein:
 the floating field plate comprises a plurality of strip-shaped structure columns arranged in parallel along the width direction of the gate structure, each strip-shaped structure column comprises a plurality of strip-shaped structures arranged in parallel along the length direction of the gate structure, and adjacent strip-shaped structures are arranged in a staggered manner along the width direction of the gate structure; or
 the floating field plate comprises a plurality of first strip-shaped structures extending along a first direction and arranged in parallel along a second direction and a plurality of second strip-shaped structures extending along the second direction and arranged in parallel along the first direction, the first strip-shaped structures the second strip-shaped structures are arranged in a crossed manner, and the first direction is perpendicular to the second direction; or
 the floating field plate comprises a plurality of strip-shaped structures extending along the width direction of the gate structure and arranged in parallel along the length direction of the gate structure and connecting parts each located in a gap between adjacent strip-shaped structures and in contact with the adjacent strip-shaped structures, the plurality of connecting parts is arranged in parallel along the width direction of the gate structure, and the adjacent connecting parts are arranged in a staggered manner along the length direction of the gate structure; or
 the floating field plate comprises a plurality of strip-shaped structures extending along the length direction of the gate structure and arranged in parallel along the width direction of the gate structure and connecting parts each located in a gap between adjacent strip-shaped structures and in contact with the adjacent strip-shaped structures, the plurality of connecting parts is arranged in parallel along the length direction of the gate structure, and the adjacent connecting parts are arranged in a staggered manner along the width direction of the gate structure.

12. The semiconductor structure according to claim 11, wherein the first direction comprises the width direction of the gate structure, or a direction having an angle of 45° with the width direction of the gate structure.

13. A method for forming a semiconductor structure, comprising:
 providing a base substrate, in which a drift region is formed;
 forming a gate structure on the base substrate, wherein the gate structure spans to cover part of a top portion of the drift region;
 forming a floating field plate on the drift region on one side of the gate structure, wherein the floating field plate has notches arranged at intervals along a width direction of the gate structure, and the floating field plate also has notches arranged at intervals along a length direction of the gate structure;
 forming a body region in the base substrate on a side of the gate structure facing away from the drift region;
 forming a drain region in the drift region on one side of the gate structure; and
 forming a source region in the body region on another side of the gate structure.

14. The method for forming a semiconductor structure according to claim 13, wherein:
 in the step of providing the base substrate, an isolation layer is further formed in the drift region between the gate structure and the drain region; and
 in the step of forming a floating field plate on the drift region between the gate structure and the drain region, the floating field plate is formed on the isolation layer.

15. The method for forming a semiconductor structure according to claim 14, wherein in the step of providing the base substrate, a reverse type ion implantation region is formed in the drift region below the isolation layer, wherein a type of ions of the reverse type ion implantation region is opposite to that of the drift region.

16. The method for forming a semiconductor structure according to claim 13, wherein the gate structure and the floating field plate are formed in the same step and the step of forming the gate structure and the floating field plate comprises:
 forming a gate material layer covering the base substrate; and
 patterning gate material layer, to retain part of the gate material layer that spans to cover part of the top portion of drift region as the gate structure and to retain part of the gate material layer on the drift region on the side of the gate structure as the floating field plate.

17. The method for forming a semiconductor structure according to claim 13, wherein before forming the source region and the drain region, the forming method further comprises: forming a protection layer on the drift region and covering the floating field plate.

18. The method for forming a semiconductor structure according to claim 17, wherein in the step of forming the protection layer, the protection layer further extends to cover part of the gate structure close to the floating field plate.

19. The method for forming a semiconductor structure according to claim 17, wherein after forming the protection layer on the drift region and covering the floating field plate, the forming method further comprises: forming an inter-layer dielectric layer covering surfaces of the gate structure, the protection layer, and the base substrate.

20. The method for forming a semiconductor structure according to claim 19, wherein after forming the inter-layer dielectric layer, the forming method further comprises:

forming a drain region contact passing through the inter-layer dielectric layer on a top portion of the drain region and in contact with a top surface of the drain region;

forming a source region contact passing through the inter-layer dielectric layer on a top portion of the source region and in contact with a top surface of the source region;

forming a gate contact passing through the inter-layer dielectric layer on a top portion of the gate structure and in contact with a top surface of the gate structure;

forming, on the inter-layer dielectric layer, a drain region field plate in contact with the drain region contact, wherein the drain region field plate extends from a position above the drain region to a position above an edge portion, of the drift region, close to the drain region; and forming, on the inter-layer dielectric layer, a source region field plate in contact with the source region contact, wherein the source region field plate extends from a position above the source region to a position above an edge portion, of the drift region, close to the body region.

* * * * *